United States Patent [19]

Shackle et al.

[11] Patent Number: 5,045,430

[45] Date of Patent: Sep. 3, 1991

[54] METHOD FOR MAKING PRINTING PLATES AND ASSEMBLY USEFUL THEREIN

[76] Inventors: Dale R. Shackle; Michael J. Cousin; Gerhart Schwab; Christina M. Narrick; Howard A. Fromson, all c/o The Mead Corporation, Courthouse Plaza Northeast, Dayton, Ohio 45463

[21] Appl. No.: 791,185

[22] Filed: Oct. 25, 1985

[51] Int. Cl.$^5$ .............................................. G03C 5/54
[52] U.S. Cl. .................................... 430/138; 430/204; 430/253
[58] Field of Search ................ 430/138, 253, 204, 202

[56] References Cited

U.S. PATENT DOCUMENTS

| | | | |
|---|---|---|---|
| 3,219,446 | 11/1965 | Berman | 430/138 |
| 3,867,150 | 2/1975 | Ketley | 96/363 |
| 4,399,209 | 8/1983 | Sanders et al. | 430/138 |
| 4,440,846 | 4/1984 | Sanders et al. | 430/138 |
| 4,483,912 | 11/1984 | Sanders | 430/138 |
| 4,508,807 | 4/1985 | Adair | 430/138 |

FOREIGN PATENT DOCUMENTS 3605120 8/1986 Fed. Rep. of Germany .

Primary Examiner—Richard L. Schilling
Attorney, Agent, or Firm—Mark P. Levy; Frederick H. Rabin

[57] ABSTRACT

A process for forming printing plates using an imaging sheet which carries a layer of microcapsules containing a photohardenable composition; the imaging sheet is preferably assembled with a printing plate support, exposed and subjected to pressure to rupture the microcapsules and differentially transfer the photohardenable composition to the support; the transferred composition is hardened to provide ink-receptive images useful in printing.

19 Claims, 1 Drawing Sheet

METHOD FOR MAKING PRINTING PLATES AND ASSEMBLY USEFUL THEREIN

BACKGROUND OF THE INVENTION

The present invention relates to a process for preparing printing plates and, more particularly, to a process for preparing printing plates without the application of wet developing agents.

Processes for forming printing plates are well known in the art. Typically, they involve exposing a plate which is uniformly coated with a photopolymerizable composition to actinic radiation through a stencil or negative. In the exposed areas the photopolymerizable composition reacts and forms water or solvent insoluble material bonded to the surface of the plate. After exposure, the portions of the photopolymerizable layer which have not been exposed to radiation are washed away to reveal the underlying surface of the plate.

In the more common printing plates, the photopolymerizable material is a water soluble, light-sensitive diazo resin which is carried on an aluminum base sheet prepared in accordance with the teachings of U.S. Pat. No. 3,181,461 to Fromson. Upon exposure, the diazo resin reacts to form a water insoluble, hydrophobic material. After exposure the plate is washed with water to remove the unexposed water soluble diazo resin and thereby expose the surface of the aluminum base sheet in those areas. The exposed surface of the aluminum base sheet absorbs water and rejects ink whereas the photohardened diazo resin rejects water and accepts the ink. The plate can be used in planographic or lithographic printing.

While photographic processes for making printing plates have been used in the art for several decades and while numerous processes have been investigated, there is still a need for a dry process for preparing printing plates—that is a process which does not require the application of solvent or water baths to develop the printing plate by selectively removing portions of the photosensitive layer.

While dry processes have been known, they have not been completely satisfactory. For example, processes employing stripping development are known wherein a photopolymerizable substratum provided on a carrier sheet is selectively adhered to a printing plate support by exposing it to radiation in contact with the support. Upon peeling the carrier sheet away from the support following exposure, and in some cases heating the support, the substratum remains on the carrier sheet in the unexposed areas and adheres to the support in the exposed areas. As will be readily appreciated these systems are difficult to design since materials must be selected such that the degree of tack or adhesion of the exposed substratum for the printing plate is greater than its adhesion for the carrier sheet in the exposed areas but less in the unexposed areas.

SUMMARY OF THE INVENTION

A principal object of the present invention is to provide a process for making printing plates without the application of wet development baths. A related object of the present invention is to provide an assembly useful in such a process wherein a layer of microcapsules containing a photohardenable composition is provided on the surface of a carrier sheet and the carrier sheet is assembled with a printing plate support.

Another object of the present invention is to provide a transfer sheet which is designed to release a photohardenable composition from a microcapsule to the surface of a printing plate support to which the photohardenable composition adheres and forms a durable oleophilic image.

The process of the present invention comprises the steps of:

image-wise exposing to actinic radiation a transfer sheet comprising a support having a layer of microcapsules on the surface thereof, said microcapsules containing a photohardenable composition which is releasable upon rupturing the microcapsules, assembling said exposed imaging sheet with a support for a printing plate, subjecting said microcapsules to a uniform rupturing force which causes said microcapsules to rupture and transfer said photohardenable composition to the surface of said printing plate support in accordance with said exposure, and uniformly exposing said printing plate to actinic radiation to harden the composition transferred thereto.

In accordance with another embodiment of the present invention, the transfer sheet is pre-assembled with the printing plate support. In this embodiment, the process of the present invention comprises the steps of:

image-wise exposing the assembly to actinic radiation, subjecting the microcapsules within said assembly to a uniform rupturing force, removing said transfer sheet, and uniformly exposing said printing plate support to actinic radiation to harden the photohardenable composition transferred thereto.

Another embodiment of the invention resides in a combination useful in forming printing plates comprising a transfer sheet including a support having on one surface thereof a layer of microcapsules containing a photohardenable composition and a support for a printing plate, said transfer sheet and said support being juxtaposed such that upon image-wise exposing said transfer sheet to actinic radiation and subjecting said microcapsules to a uniform rupturing force, said photohardenable composition is transferred to said printing plate support according to said exposure.

DEFINITIONS

The term "microcapsule" as used herein includes microcapsules having a discrete wall, such as a ureaformaldehyde wall, and microcapsules in an open phase system obtained by dispersing a photohardenable composition in a binder.

The term "photohardenable composition" as used herein refers to photosensitive compositions which increase in viscosity directly or indirectly as a consequence of their exposure to radiation. The term includes, but is not limited to, radiation curable compositions, thermally polymerizable compositions, photopolymerizable compositions and compositions which undergo an exposurecontrolled increase in viscosity as a result of post-heat treatment.

DETAILED DESCRIPTION OF THE INVENTION

Figure 1:
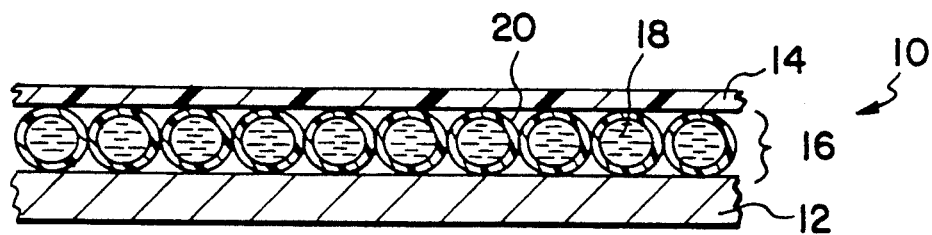
FIGS. 1-4 schematically illustrate the process of the present invention.

The teachings in U.S. Pat. No. 4,399,209 are useful in forming the transfer sheet used in the present invention.

The photohardenable compositions used in the present invention can be designed to be sensitive to ultraviolet, infrared, visible, X-ray, ion beam radiation and the like. This is accomplished through a judicious selection of the photohardenable composition and the photoinitiator.

The photohardenable compositions used in the present invention can be selected from among photohardenable compositions which are well known in the art. The most typical examples of such compositions are compositions including ethylenically unsaturated compounds. These compounds contain at least one terminal ethylene group per molecule. Typically, liquid ethylenically unsaturated compounds having two or more terminal ethylene groups per molecule are preferred. Examples of this preferred group are ethylenically unsaturated acid esters of polyhydric alcohols such as ethylene glycol dimethacrylate, triethylene glycol dimethacrylate, trimethylolpropane triacrylate (TMPTA) and trimethyolpropane trimethacrylate (TMPTMA), styrene, divinylbenzene and derivatives thereof.

Another example of a useful radiation sensitive composition is an acrylate prepolymer derived from the partial reaction of pentaerythritol with acrylic acid, methacrylic acid, or acrylic or methacrylic acid esters. Another group of materials useful as photohardenable compositions include isocyanate prepolymers modified with acrylic, methacrylic and itaconic acid esters of polyhydric alcohols. Representative examples of acrylate terminated urethane prepolymers that are anticipated to be useful in the present invention include Chempol 19-4832 and Chempol 19-4833 available from Freeman Chemical Corporation; Uvithane 893, 788, 782 and 783 available from Thiokol Corporation; Ebercryl 220, 204, 210 and 240 available from Virginia Chemicals, Inc.; etc. Examples of epoxy acrylate prepolymers include Chempol 19-4824 and Chempol 19-4825 from Freeman Chemical Corp.; Celrad 3200, 3700 and 3701 from Celanese Corp.; Ebercryl 600 series prepolymers from Virginia Chemicals, Inc.; etc.

Photopolymerizable prepolymers are also useful in the present invention. Suitable prepolymers can be selected from commercially available acrylate terminated polyurethanes, polyesters and polyethers. Typically, these compounds are prepared by end capping isocyanate terminated prepolymers with acrylic or methacrylic acid. The prepolymers can range up to about 16,000 in molecular weight, but in most cases do not exceed about 1,000 to 3,000 in molecular weight. If the molecular weight of the prepolymer is too high, it may be too viscous to be adequately emulsified for encapsulation. However, higher molecular weight prepolymers can be used in the present invention if they are diluted with low molecular weight reactive monomers such as TMPTA.

It is particularly desirable to use a mixture of a multifunctional acrylic monomer such as TMPTA and an acrylate-capped pre-polymer such as an acrylate-capped polyurethane in the photosensitive composition. One such composition is made up of a 60% diacrylate-capped pre-polymer, 30-40% of a monomeric, low molecular weight diacrylate, and up to 10% of TMPTA.

In most cases, the photohardenable composition includes a photoinitiator. It is possible to use either homolytic photoinitiators which are converted to an active species by radiation and generate a radical by abstracting hydrogen from a hydrogen donor, or photoinitiators which complex with a sensitizer to produce a free radical generating species, or photoinitiators which otherwise generate radicals in the presence of a sensitizer. If the system relies upon ionic polymerization, the photoinitiator may be the anion or cation generating type depending on the nature of the polymerization.

Examples of photoinitiators useful in the present invention include diaryl ketone derivatives, and benzoin alkyl ethers. The photoinitiator is selected based on the sensitivity of the system that is desired. Where ultraviolet sensitivity is desired, suitable photoinitiators include alkoxy phenyl ketones, 0-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of compounds to provide a photoinitiator system. Useful systems include co-initiators such as certain tertiary amines and, more particularly, certain N,N-dimethylanilines. It is particularly desirable to include a hydrogen donor such as ethyl p-dimethylaminobenzoate in the composition. The 3-substituted coumarin compounds described in U.S. Pat. No. 4,147,552 are also useful herein. For ultraviolet sensitivity a combination of Michler's ketone and benzoin methyl ether (ratio 2:5) may be used. Other useful combinations are 2,2'-dimethoxy-2-phenylacetophenone, isopropylxanthone and ethyl p-dimethylaminobenzoate; or Quanticure EPD, Irgacure 651 and Quanticure CTX (2-chlorothioxanthone).

The amount of photoinitiator used in the photo-sensitive composition depends on the particular photohardenable composition selected. It should be present in an amount sufficient to initiate photopolymerization within a short exposure time. The photoinitiator may also be used to sequester oxygen, which is present in the microcapsules and inhibits photopolymerization. In some cases it is desirable to conduct a non-imaging, oxygen sequestering pre-exposure or co-exposure to sequester the oxygen in the microcapsules before conducting the image-wise exposure. When the photoinitiator is also relied upon to sequester oxygen, it must be used in amounts sufficient to fulfill both this function and its imaging function.

To obtain improved film speed, it may be desirable to incorporate certain prepolymers in the microcapsules such as a diallyl o-phthalate prepolymer. Prepolymers such as this are believed to enhance film speed by accelerating the rate with which the viscosity of the internal phase builds upon exposure. Waxes can also be used for this purpose.

In addition to the foregoing materials, certain photohardenable compositions conventionally used in making printing plates may be useful in the present invention provided that these compositions can be satisfactorily encapsulated. Typical examples include photosensitive phenol-formaldehyde novolak resins, diazo compounds, etc.

For certain applications, it may be desirable to modify the photohardenable composition to enhance the oleophilic nature of the polymer image that is formed. In particular, ethylenically unsaturated monomers such as TMPTA are relatively hydrophilic. To enhance oleophilicity, it is sometimes desirable to use oleophilic additives such as waxes, cellulose acetate, cellulose nitrate, polybutadiene, and the like. The function of these additives is to enhance the affinity of the polymer image for printing ink in preference to water.

Conventional techniques such as coacervation, liquid-liquid phase separation, interfacial polymerization and the like can be used to form the microcapsules. Various melting, dispersing and cooling methods may also be used.

The photosensitive compositions are usually oleophilic and therefore preferably encapsulated in hydrophilic wall-forming materials such as gelatin-type materials (see U.S. Pat. No. Nos. 2,730,456 and 2,800,457 to Green et al.) including gum arabic, polyvinyl alcohol, carboxymethyl-cellulose; resorcinol-formaldehyde wall formers (see U.S. Pat. No. No. 3,755,190 to Hart et al.); isocyanate wall-formers (see U.S. Pat. No. No. 3,914,511 to Vassiliades); isocyanate-polyol wall-formers (see U.S. Pat. No. 3,796,669 to Kirintani et al.); urea formaldehyde wall-formers (see U.S. Pat. No. Nos. 4,001,140, 4,087,376 and 4,089,802 to Foris et al.); particularly urea-resorcinol-formaldehyde in which oleophilicity is enhanced by the addition of resorcinol and melamineformaldehyde wall-formers and hydroxypropyl cellulose (see commonly assigned U.S. Pat. No. No. 4,025,455 to Shackle). One method for forming microcapsules that is particularly useful is described in U.S. Pat. No. 4,353,809 and utilizes a polyisocyanate in the oil phase as an emulsion stabilizer.

It has been found that the microcapsules, average diameters desirably range from about 3 to 15 microns. The microcapsules can be coated on a support to form the transfer sheet using conventional coating techniques such as blade coating, air-knife coating, curtain coating, etc. The microcapsules are preferably applied to the support neat, e.g., dispersed in water, however, it may be desirable to include a small amount of an adhesive such as polyvinyl alcohol or Rohm & Haas latex P-310 (an alkali swellable acrylic-vinyl acetate emulsion) with the microcapsules to improve their adhesion to the substrate. The microcapsules are preferably coated on the transfer sheet support in a capsule coating weight of about 1.5 to 5.0 lbs. per 3000 sq. ft.

Various substrates can be used in the present invention including both transparent and opaque substrates such as paper and plastic films such as polyethylene terephthalate. The latter are useful when the transfer sheet is pre-assembled with the printing plate support since they permit the microcapsules to be exposed from the support-side of the transfer sheet.

The transfer sheet can be exposed in an assembled or unassembled condition with the printing plate support. Exposure can be conducted using conventional radiation sources. Among the exposure techniques that can be used are exposure through a mask using ultraviolet or visible radiation, e.g., using a mercury, carbon, or xenon arc or a tungsten lamp; or exposure with an ultraviolet laser, a visible laser, or an argon ion laser.

The printing plate support can be selected from among the supports conventionally used in the art. A support will be selected which exhibits the desired hydrophilic characteristic and good adhesion for the photohardenable composition released from the microcapsules. A preferred support is the anodized aluminum support treated with an alkali metal silicate as described in U.S. Pat. No. 3,181,461. Other useful printing plates supports include oxidized aluminum, stainless steel, cobalt-plated steel, copper-coated steel, chrome-plated steel, coated papers such as polyolefin coated paper, polymeric substrates such as polyethylene terephthalate, copper-coated epoxy, etc.

A number of techniques can be used to rupture the microcapsules. The most common is application of a pressure roller. The amount of pressure applied should be adjusted such that the microcapsules in the unexposed or underexposed areas are forced to rupture and exude their contents. It is not clear whether this force actually ruptures the microcapsules in the fully exposed areas or not. If the force applied does rupture the fully exposed capsules it should not force these microcapsules to transfer their contents to the printing plate as this will produce background coloring and spotting. In addition to pressure, the microcapsules can be designed to be ruptured by heating or ultrasonically. A fibrous developer roller of the type described in U.S. Pat. No. 4,448,516 can also be used.

The process of the present invention is illustrated in FIGS. 1-4. The process is illustrated for the embodiment of the invention in which a transfer sheet 10 is pre-assembled with a printing plate support 12. The transfer sheet 10 comprises a support 14 which carries a layer 16 of microcapsules 20 containing a photohardenable composition in the internal phase 18. In this embodiment the support 14 is transparent.

Figure 2:
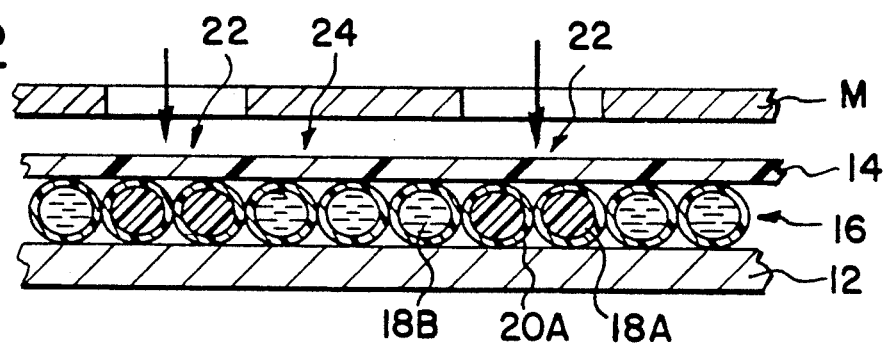
Figure 3:
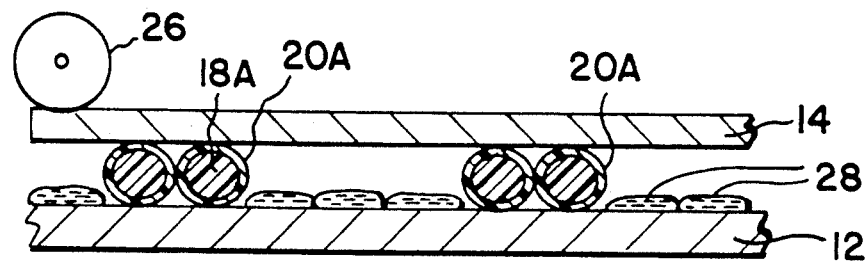
Figure 4:
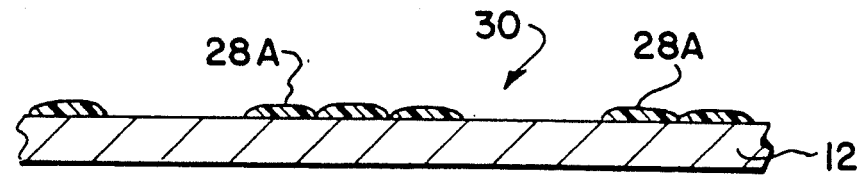

The microcapsules are exposed to radiation through a mask M as shown in FIG. 2. Exposure hardens the internal phase 18A in the exposed areas 22 but the internal phase 18B remains unhardened in the unexposed areas 24. The microcapsules 20 are ruptured by passing a pressure roller 26 over the surface 27 of the transfer sheet 10 while supporting the plate in an appropriate manner. This has the effect of rupturing the microcapsules in the unexposed areas 24 and causing them to release their contents 28 to the underlying support 12. The exposed microcapsules 20B do not release the internal phase 18B. The transfer sheet 10 is removed and the support 12 carrying the released photohardenable composition 28 is uniformly exposed to radiation. This hardens the composition 28A as shown in FIG. 4, and the printing plate 30 is thus formed. The areas in which the plate is covered with the hardened composition 28 are hydrophobic or oleophilic and are receptive to printing ink. The areas in which the plate is not coated are hydrophilic and not receptive of the printing ink.

In some instances it may be desirable to heat the printing plate and/or the transfer sheet to drive or accelerate photohardening. Thus, the calender roll 26 may be heated or the assembly may be heated in a separate step after image-wise exposure and before rupturing the microcapsules Analogously, after transferring the photohardenable composition to the printing plate support, the support may be heated to harden the transferred composition. In this regard, the step of uniformly exposing the plate can consist of heating the plate alone; heating the plate in combination with exposure to ultraviolet, visible radiation or the like; or exposure to visible, ultraviolet or like non-thermal radiation alone. It may be desirable to include a thermal initiator in the microcapsules as described in U.S. Pat. No. 4,483,912 if heating is used to harden the transferred composition.

The transfer sheet may be sold attached to or separate from the printing plate support. For example, the transfer sheet may be provided on a roll and assembled with the printing plate support before or after exposure. When the transfer sheet is sold assembled with the printing plate support it may be adhered thereto by a bead of adhesive along its perimeter. When the transfer sheet is not preassembled with the printing plate support, the sheet may be exposed prior to or after its assembly with the printing plate support.

For many of the applications for printing plates, high photographic speed will not be required. Where high speed is desirable, the speed of the transfer sheet can be enhanced by conducting a pre-exposure as described in U.S. Pat. No. 4,482,624. Certain thiols can also be incorporated in the microcapsules to improve film speed.

The present invention provides a printing plate support having polymer images on the surface thereof. This product can be used as is, depending upon the nature of the support and the polymer images, by applying ink to the surface and printing. Alternatively, the plate with the polymer images on its surface be be processed with an etchant in a manner well known in the art.

The present invention is illustrated in more detail by the following example.

EXAMPLE

Capsule Preparation

1. Into a 600 ml stainless steel beaker, 125 g water and 27.5 g isobutylene maleic anhydride copolymer (22.7%) are weighed.
2. The beaker is clamped in place on a hot plate under an overhead mixer. A six-bladed, 45° pitch, turbine impeller is used on the mixer.
3. After thoroughly mixing, 3.1 g pectin is slowly sifted into the beaker. This mixture is stirred for 20 minutes.
4. The pH is adjusted to 4.0 using a 20% solution of $H_2SO_4$.
5. The mixer is turned up to 3000 rpm and the internal phase is added over a period of 10–15 seconds. Emulsification is continued for 10 minutes.
6. At the start of emulsification, the hot plate is turned up so heating continues during emulsification.
7. After 10 minutes, the mixing speed is reduced to 2000 rpm and 8.3 g urea in 10 ml water, 0.8 g resorcinol in 10 g water, 21.6 g formaldehyde (37%), and 0.6 g ammonium sulfate in 10 ml water are added at two-minute intervals.
8. The beaker is covered with foil and a heat gun is used to help bring the temperature of the preparation to 65° C. When 65° C. is reached, the hot plate is adjusted to maintain this temperature for a two to three hour cure time during which the capsule walls are formed.
9. After curing, the heat is turned off and the pH is adjusted to 9.0 using a 20% NaOH solution.
10. Dry sodium bisulfite (2.8 g) is added and the capsule preparation is cooled to room temperature.

The internal phase consisted of:

| | |
|---|---|
| Difunctional urethane acrylate resin (Actocryl 310 from Ancomer Ltd., Manchester, England) | 20.7 g |
| Hexanediol diacrylate | 20.7 g |
| TMPTA | 4.6 g |
| 2,2 Dimethoxy-2-phenylacetophenone | 2.5 g |
| 2-Chlorothioxanthone | 1.0 g |
| Ethyl p-dimethylaminobenzoate | 0.5 g |

| -continued | |
|---|---|
| Sudan Orange | 0.75 g |
| SF-50 (Aromatic polyurethane prepolymer from Union Carbide) | 1.67 g |
| N-100 (Alphatic polyurethane prepolymer from Mobay) | 3.33 g |

The capsules obtained ranged from 2 to 32 microns in mean diameter. A coating composition containing the following was coated on a mylar sheet with a #12 meyer bar and air dried.

| | |
|---|---|
| Capsules at 35% | 10.0 g |
| Rhoplex P-310 (Rohm & Haas) | 5.0 g |
| Triton X-100 (Rohm & Haas) | 4 drops |
| Water | 5.0 g |

The coating was applied in a coat weight of 4 lbs. per 3000 sq. ft. The sheet was mounted on an anodized aluminum plate with the capsule coating facing the anodized surface. Exposure was conducted for 30 seconds using four 15 watt BLB tubes (General Electric). The assembly was passed through a supercalender. The sheet was removed and aftercured 20 minutes using the same light source. The plates were run on an AM-1250 Multigraph wet offset press.

Having described the invention in detail and by reference to specific embodiments thereof, it will be apparent that numerous modifications and variations are possible without departing from the spirit and scope of the invention defined by the following claims.

What is claimed is:

1. A process for producing a printing plate comprising:
   image-wise exposing to actinic radiation a transfer sheet including a support having a layer of microcapsules on the surface thereof, said microcapsules enveloping a photohardenable composition,
   prior to or after image-wise exposing said transfer sheet, assembling said transfer sheet with a support for a printing plate selected from the group consisting of anodized aluminum, oxidized aluminum, stainless steel, cobalt-plated steel, copper-coated steel, chrome-plated steel, polyolefin-coated paper, and copper-coated epoxy,
   subjecting said image-wise exposed transfer sheet assembled with said support for said printing plate to a uniform rupturing force such that said microcapsules rupture and image-wise transfer and photohardenable composition to said support for said printing plate,
   removing said transfer sheet from said support for said printing plate, and
   hardening said transferred photohardenable composition to form a polymer image which accepts ink and rejects water.
2. The process of claim 1 wherein said microcapsule has a discrete capsule wall.
3. The process of claim 2 wherein said photohardenable composition includes an ethylenically unsaturated compound and a photoinitiator.
4. The process of claim 2 wherein said support for said printing plate is anodized aluminum.
5. The process of claim 1 wherein said transfer sheet is assembled with said support for said printing plate prior to image-wise exposing said transfer sheet.

6. The process of claim 5 wherein said transfer sheet is affixed to said support for said printing plate.

7. The process of claim 1 wherein said uniform rupturing force is pressure.

8. The process of claim 7 wherein said pressure is achieved by passing a pressure roller over the surface of said transfer sheet while said transfer sheet is in contact with said support for said printing plate.

9. The process of claim 8 wherein said uniform rupturing force is achieved by contacting the surface of said transfer sheet opposite said support for said printing plate with a roll having a fibrous outer surface.

10. The process of claim 1 wherein said step of hardening said transferred photohardenable composition comprises heating said support.

11. The process of claim 1 wherein said photohardenable composition includes a thermal initiator.

12. The process of claim 1 wherein said step of hardening said transferred photohardenable composition comprises uniformly exposing said support to visible light or ultraviolet radiation.

13. A combination for producing a printing plate comprising a transfer sheet including a support having a layer of microcapsules on one surface thereof, said microcapsules containing a photohardenable composition in the internal phase; and a support for a printing plate selected from the group consisting of anodized aluminum, oxidized aluminum, stainless steel, cobalt-plated steel, copper-coated steel, chrome-plated steel, polyolefin-coated paper, and copper-coated epoxy; said combination being useful in forming a printing plate by a process including the steps of image-wise exposing said transfer sheet to actinic radiation, subjecting said transfer sheet to a uniform rupturing force in contact with said printing plate support such that said microcapsules rupture and said photohardenable composition is image-wise transferred to said printing plate support, and hardening said transferred composition to form a polymer image which accepts ink and rejects water.

14. The combination of claim 1 wherein said microcapsules have a discrete capsule wall.

15. The combination of claim 14 wherein said photohardenable composition includes an ethylenically unsaturated compound and a photoinitiator.

16. The process of claim 4 wherein said anodized aluminum has been treated with an alkali metal silicate.

17. A process for producing a printing plate comprising:
treating anodized aluminum with an alkali metal silicate to form the surface of a support for a printing plate,
image-wise exposing to actinic radiation a transfer sheet including a support having a layer of microcapsules on the surface thereof, said microcapsules enveloping a photohardenable composition,
prior to or after image-wise exposing said transfer sheet, assembling said transfer sheet with said support for a printing plate,
subjecting said image-wise exposed transfer sheet assembled with said support for a printing plate to a uniform rupturing force such that said microcapsules rupture and image-wise transfer said photohardenable composition to the surface of said support for a printing plate,
removing said transfer sheet from said support for a printing plate,
and hardening said transferred photohardenable composition to form an ink-receptive polymer image.

18. The combination of claim 13 wherein said support for said printing plate is anodized aluminum treated with an alkali metal silicate.

19. A process for producing a printing plate comprising:
image-wise exposing to actinic radiation a transfer sheet including a support having a layer of microcapsules on the surface thereof, said microcapsules enveloping a photohardenable composition,
prior to or after image-wise exposing said transfer sheet, assembling said transfer sheet with a support for a printing plate,
subjecting said image-wise exposed transfer sheet assembled with said support for said printing plate to an uniform rupturing force such that said microcapsules rupture and image-wise transfer said photohardenable composition to said support for said printing plate,
removing said transfer sheet from said support for said printing plate, and
uniformly exposing the said support for the said printing plate to radiation to harden said transferred photohardenable composition to form a polymer image which accepts ink and rejects water.

* * * * *